(12) United States Patent
Jun et al.

(10) Patent No.: US 9,613,884 B2
(45) Date of Patent: Apr. 4, 2017

(54) SEMICONDUCTOR DEVICE

(71) Applicant: ELECTRONICS AND TELECOMMUNICATIONS RESEARCH INSTITUTE, Daejeon (KR)

(72) Inventors: Chi Hoon Jun, Daejeon (KR); Jeho Na, Seoul (KR); Dong Yun Jung, Anyang-si (KR); Sang Choon Ko, Daejeon (KR); Eun Soo Nam, Daejeon (KR); Hyung Seok Lee, Seongnam-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/872,868

(22) Filed: Oct. 1, 2015

(65) Prior Publication Data
US 2016/0260653 A1   Sep. 8, 2016

(30) Foreign Application Priority Data
Mar. 3, 2015 (KR) .................. 10-2015-0029809

(51) Int. Cl.
*H01L 23/34* (2006.01)
*H01L 23/467* (2006.01)

(52) U.S. Cl.
CPC ................... *H01L 23/467* (2013.01)

(58) Field of Classification Search
CPC ........................................................ H01L 23/467
USPC ............................................................ 257/722
See application file for complete search history.

(56) References Cited

U.S. PATENT DOCUMENTS

| 6,331,074 B1 * | 12/2001 | Kimura | G01N 5/04 |
| | | | 219/209 |
| 2006/0113063 A1 | 6/2006 | Chordia et al. | |
| 2007/0215325 A1 | 9/2007 | Solovitz et al. | |
| 2008/0185128 A1 | 8/2008 | Moon et al. | |
| 2010/0108296 A1 | 5/2010 | Moon et al. | |
| 2013/0141127 A1 * | 6/2013 | Yasuta | G01R 1/067 |
| | | | 324/750.03 |

OTHER PUBLICATIONS

P.C. Chao et al., "A New High Power GaN-on-Diamond HEMT with Low-Temperature Bonded Substrate Technology", CS MANTECH Conference, pp. 179-182, May 13-16, 2013.
Yong Jiun Lee et al., "GaN-on-Si Hotspot Thermal Management Using Direct-die-attached Microchannel Heat Sink", 2012 IEEE 14th Electronics Packaging Technology Conference, no. 12, pp. 577-581, 2012.

* cited by examiner

*Primary Examiner* — Theresa T Doan
(74) *Attorney, Agent, or Firm* — Rabin & Berdo, P.C.

(57) ABSTRACT

Provided is a semiconductor device. The semiconductor device includes a substrate including a cantilever configured to generate a flow of cooling media through dynamic movement, an active area on the substrate which an electronic device is provided on, an insulation layer disposed to be spaced apart from the active area on the substrate, a lower electrode on the insulation layer, a piezoelectric film on the lower electrode, and an upper electrode on the piezoelectric film.

16 Claims, 5 Drawing Sheets

SEMICONDUCTOR DEVICE

CROSS-REFERENCE TO RELATED APPLICATIONS

This U.S. non-provisional patent application claims priority under 35 U.S.C. §119 of Korean Patent Application No. 10-2015-0029809, filed on Mar. 3, 2015, the entire contents of which are hereby incorporated by reference.

BACKGROUND

The present disclosure herein relates to a semiconductor device, and more particularly, to a semiconductor device having an integrated cooling structure.

When a semiconductor device is applied to a module, a component, or a system, heat management of the semiconductor device has emerged as a key issue that affects an overall reliability. That is, when the heat management is not properly performed, heating is locally generated during an operation of the semiconductor device to reduce characteristics of the semiconductor device or cause degradation of inner metallization lines due to electromigration of atoms constituting the metallization lines, thereby causing malfunction or breakdown of the semiconductor device.

SUMMARY

The present disclosure provides a semiconductor device having a cooling structure that is integrated therein without a separate cooling device or apparatus.

An embodiment of the inventive concept provides a semiconductor device including a substrate including a cantilever configured to generate a flow of cooling media through dynamic movement, an active area on the substrate which an electronic device is provided on, an insulation layer disposed to be spaced apart from the active area on the substrate, a lower electrode on the insulation layer, a piezoelectric film on the lower electrode, and an upper electrode on the piezoelectric film.

In an embodiment, the substrate may include a main body on which the active area is disposed and the cantilever extending from at least one side of the main body, and the cantilever may have a thickness less than that of the main body.

In an embodiment, a top surface of the cantilever may have the same level as a top surface of the main body, and an open space in which the cantilever is movable may be provided below a bottom surface of the cantilever.

In an embodiment, the cantilever may have a thickness of about 1 μm to about 100 μm.

In an embodiment, the cantilever and the main body may be formed of the same material, and the material may include silicon (Si), silicon carbide (SiC), gallium nitride (GaN), or gallium arsenide (GaAs).

In an embodiment, the insulation layer may be disposed to cover portions of top surfaces of the cantilever and the main body.

In an embodiment, the cantilever may be provided on one side of the substrate.

In an embodiment, the cantilevers may be provided on one side and the other side facing the one side of the substrate.

In an embodiment, the active area may include a transistor, a diode, a thyristor, a central processing unit (CPU), an application specific integrated circuit (ASIC), a microsensor, a microactuator, or a microelectromechanical system (MEMS).

In an embodiment, the semiconductor device may further include a power source unit electrically connected to the lower electrodes and the upper electrodes. The power source unit may apply electric energy to the piezoelectric film through the lower electrodes and the upper electrodes.

In an embodiment of the inventive concept, a semiconductor device includes a substrate including an active area on which an electronic device is provided, and a first cooling unit configured to cool the active area through dynamic movement. The first cooling unit includes a cantilever extending from one side of the substrate, the cantilever having a thickness less than that of the substrate, a piezoelectric film configured to cause vibration of the cantilever and generate mechanical strain by applied electric energy, and a pair of counter electrodes with the piezoelectric film therebetween.

In an embodiment, the counter electrodes may include a lower electrode on a bottom surface of the piezoelectric film, and an upper electrode on a top surface of the piezoelectric film.

In an embodiment, the semiconductor device may further include a lower electrode pad on the exposed lower electrode, and an upper electrode pad on the upper electrode.

In an embodiment, the semiconductor device may further include a power source unit electrically connected to the lower electrode pad and the upper electrode pad. The power source unit may be configured to supply electric energy to the piezoelectric film through the lower electrode pads and the upper electrode pads.

In an embodiment, the semiconductor device may further include a second cooling unit provided on the other side facing the one side of the substrate. The second cooling unit may have the same structure as the first cooling unit.

In an embodiment, the semiconductor device may further include an open space provided below a bottom surface of the cantilever. The open space may have a height greater than an amplitude of the cantilever.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
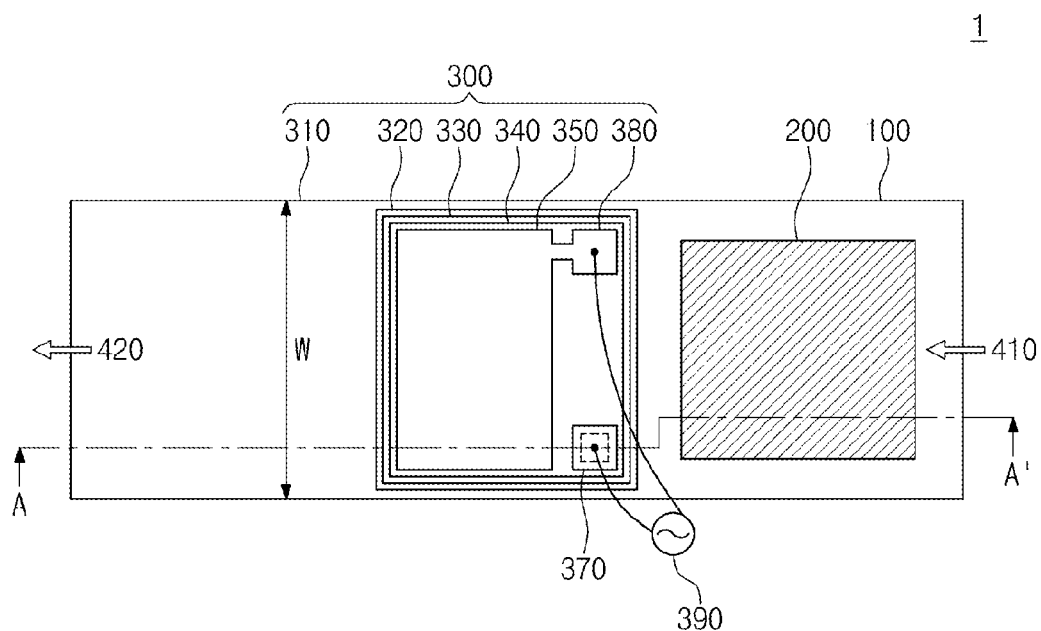
FIG. 1 is a plan view of a semiconductor device according to an embodiment of the inventive concept.

Advantages and features of the present invention, and implementation methods thereof will be clarified through following embodiments described with reference to the accompanying drawings. The present invention may, however, be embodied in many different forms and should not be construed as being limited to the embodiments set forth herein. Rather, these embodiments are provided so that this disclosure will be thorough and complete, and will fully convey the concept of the invention to those skilled in the art. Further, the present invention is only defined by scopes of claims. Like reference numerals refer to like elements throughout.

The embodiments in the detailed description will be described with sectional views and/or plain views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etched region having a right angle illustrated in the drawings may have a round shape or a shape having a predetermined curvature. Areas exemplified in the drawings have general properties, and are used to illustrate a specific shape of a semiconductor package region. Thus, this should not be construed as limited to the scope of the present invention.

Figure 2:
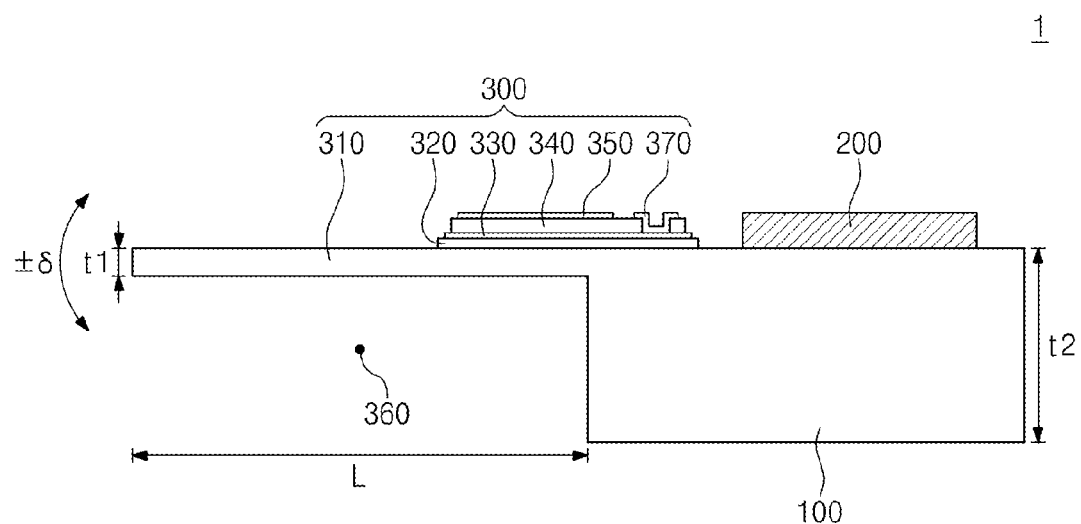
FIG. 2 is a cross-sectional view taken along line A-A' of FIG. 1.

FIG. 1 is plan view of a semiconductor device according to an embodiment of the inventive concept, and FIG. 2 is a cross-sectional view taken along line A-A' of FIG. 1.

Referring to FIGS. 1 and 2, a semiconductor device 1 may include a substrate 100, an active area 200, and a cooling unit 300. The substrate 100 may include silicon (Si), silicon carbide (SiC), gallium nitride (GaN), or gallium arsenide (GaAs). However, the substrate 100 according to an embodiment of the inventive concept is not limited to the above-described materials. For example, various materials may be used for the substrate 100.

The active area 200 may be disposed on the substrate 100. The active area 200 may serve as an electronic device. The active area 200 may include a transistor, a diode, a thyristor, a central processing unit (CPU), an application specific integrated circuit (ASIC), a microsensor, a microactuator, or a microelectromechanical system (MEMS).

Cooling media 410 and 420 are media for cooling down the semiconductor device 1. A single-phase fluid constituted by gas or liquid, a two-phase fluid in which gas and liquid are mixed, or a supercritical liquid may be used as the cooling media 410 and 420. The cooling media 410 and 420 may be provided to one side of the substrate 100 and move from the active area 200 toward the cooling unit 300.

The cooling unit 300 may include a cantilever 310, a lower electrode 330, a piezoelectric film 340, an upper electrode 350, a lower electrode pad 370, and an upper electrode pad 380.

The cantilever 310 may release heat generated in the active area 200 of the semiconductor device 1 through dynamic movement. The cantilever 310 may extend from one side surface of the substrate 100. The cantilever 310 may have a thickness less than that of the substrate 100. For example, the cantilever 310 may have a thickness t1 of about 1 μm to about 100 μm, and the substrate 100 may have a thickness t2 of several tens μm to several hundreds μm. The cantilever 310 may have a width W that is determined by the active area 200. The cantilever 310 may have a width W similar to a size of the active area 200. For example, the cantilever 310 may have a width W of several tens μm to several thousands μm. The more the cantilever 310 increases in length L, the more the cantilever 310 increases in a vibration amplitude (±δ). However, since the cantilever 310 has a thin thickness t1, the cantilever 310 may be bent when the cantilever 310 has a too long length L. For example, the cantilever 310 may has a length L of several tens μm to several thousands μm. The cantilever 310 may be the same material as the substrate 100. The cantilever 310 may include silicon (Si), silicon carbide (SiC), gallium nitride (GaN), or gallium arsenide (GaAs). However, the cantilever 310 according to an embodiment of the inventive concept is not limited to the above-described materials. For example, the cantilever 310 may be formed of various materials.

The cantilever 310 may be vibrated to flow the cooling media 410 and 420 and release heat generated in the active area 200 according to the flow of the cooling media 410 and 420. An open space 360 may be provided below the cantilever 310 so that the cantilever 310 vertically vibrates. The open space 360 may have a height greater than a vibration amplitude±δ of the cantilever 310. The height of the open space 360 may be determined by the thickness t2 of the substrate 100.

The piezoelectric film 340 may be disposed on the lower electrode 330. The piezoelectric film 340 may expose a portion of the lower electrode 330. The piezoelectric film 340 may be extended and contracted by electrical energy applied through the lower electrode 330 and the upper electrode 350. As the piezoelectric film 340 is extended and contracted, the cantilever 310 may vibrate. The piezoelectric film 340 may include at least one of an inorganic material, an organic material, a nano material, and a combination thereof. For example, the piezoelectric film 340 may include metal nitride or metal oxide such as aluminum nitride (AlN), zinc oxide (ZnO), barium titanate ($BaTiO_3$), lead zirconate titanate (PZT, $PbZr_xTi_{1-x}O_3$), and PMN-PT$[_{(1-x)}$ $Pb(Mg_{1/3}Nb_{2/3})O_{3-x}PbTiO_3]$, an inorganic material such as ceramic, an organic material such as polyvinylidene fluoride (PVDF), and a nano material such as a nano wire and a nanotube.

The upper electrode 350 may be disposed on the piezoelectric film 340. The lower electrode 330 and the upper electrode 350 may form a pair of counter electrodes that are separated from each other. At least one of the lower electrode 330 and the upper electrode 350 may be provided as an electrically conductive film having a single layer or multi-layers. For example, the conductive film may include a metal such as titanium (Ti), chrome (Cr), platinum (Pt), nickel (Ni), silver (Ag), aluminum (Al), tantalum (Ta), molybdenum (Mo), tungsten (W), copper (Cu), or gold (Au), a metal compound or metal mixture such as TiW, TiN, TaN, WN, or NiV, and a nano material such as a carbon nanotube (CNT) and graphene.

The lower electrode pad 370 electrically connected to the lower electrode 330 may be disposed on the lower electrode 330 exposed through the piezoelectric film 340. The lower electrode pad 370 may contact the lower electrode 330. The upper electrode pad 380 electrically connected to the upper electrode 350 may be disposed on the piezoelectric film 340. For example, each of the lower electrode pad 370 and the upper electrode pad 380 may include an electrically conductive material. The lower electrode pad 370 and the upper electrode pad 380 may be connected to a power source unit 390. The power source unit 390 may provide AC current. The power source unit 390 may apply external electrical energy to the piezoelectric film 340 through the lower electrode pad 370 and the upper electrode pad 380.

The piezoelectric film 340 may be extended and contracted by mechanical strain generated to correspond to the electrical energy applied through the lower electrode pad 370 and the upper electrode pad 380. Here, vertical vibration having a great displacement caused by amplifying mechanical deformation generated in the piezoelectric film 340 may be generated at an end of the cantilever 310. The vibration of the cantilever 310 may range from several Hz to several tens kHz. The cantilever 310 may vertically vibrate to physically transfer the cooling media 410 and 420 around the active area 200 and to cause a flow of the cooling media 410 and 420 around the semiconductor device 1. Thus, the high-temperature cooling medium 420 that is stayed on a surface of the active area 200 may be discharged to an end of the cantilever 310 by the flow of the cooling media 410 and 420, and the cold cooling medium 410 may flow to the active area 200. As the cold cooling medium 410 is introduced to the active area 200, the semiconductor device 1 may be cooled by forced convective heat transfer.

The cooling unit 300 may further include the substrate 100, the cantilever 310, the active area 200, and an insulation layer 320 configured to electrically insulate the cooling unit 300 from the substrate 100. The insulation layer 320 may be disposed to be spaced apart from the active area 200 on the substrate 100 and the cantilever 310. The insulation layer 320 may be disposed to cover portions of the substrate 100 and the cantilever 310.

The semiconductor device 1 may be disposed within a package (not shown) or a can (not shown). The package (not shown) or the can (not shown) may surround the semiconductor device 1 and provide a space in which the cooling media 410 and 420 flow.

The semiconductor device 1 according to an embodiment of the inventive concept may include a cooling unit 300 that is integrated in the semiconductor device 1 without a separate cooling device or apparatus. Thus, the semiconductor device 1 may have a small volume, not generate noise caused by a cooling fan or the like, and be manufactured at low costs. In addition, the semiconductor device 1 according to an embodiment of the inventive concept may have lower power consumption because the semiconductor device 1 does not require the separate cooling device or apparatus. Since the active area 200 of the semiconductor device 1 is cooled at low electric power, reliability and durability of the semiconductor device 1 may be improved.

The semiconductor device 1 may be an electronic device used for converting and controlling an electric power and outputting a high-frequency wireless signal. The semiconductor device 1 may have characteristics that operates at high voltage, high current, and high output. The semiconductor device 1 may be a transistor (e.g. MOSFET, MESFET, HEMT, JFET, IGBT, and BJT), a diode (e.g. Schottky diode, PiN diode, light emitting diode, and laser diode), a thyristor, or the like.

Figure 3:
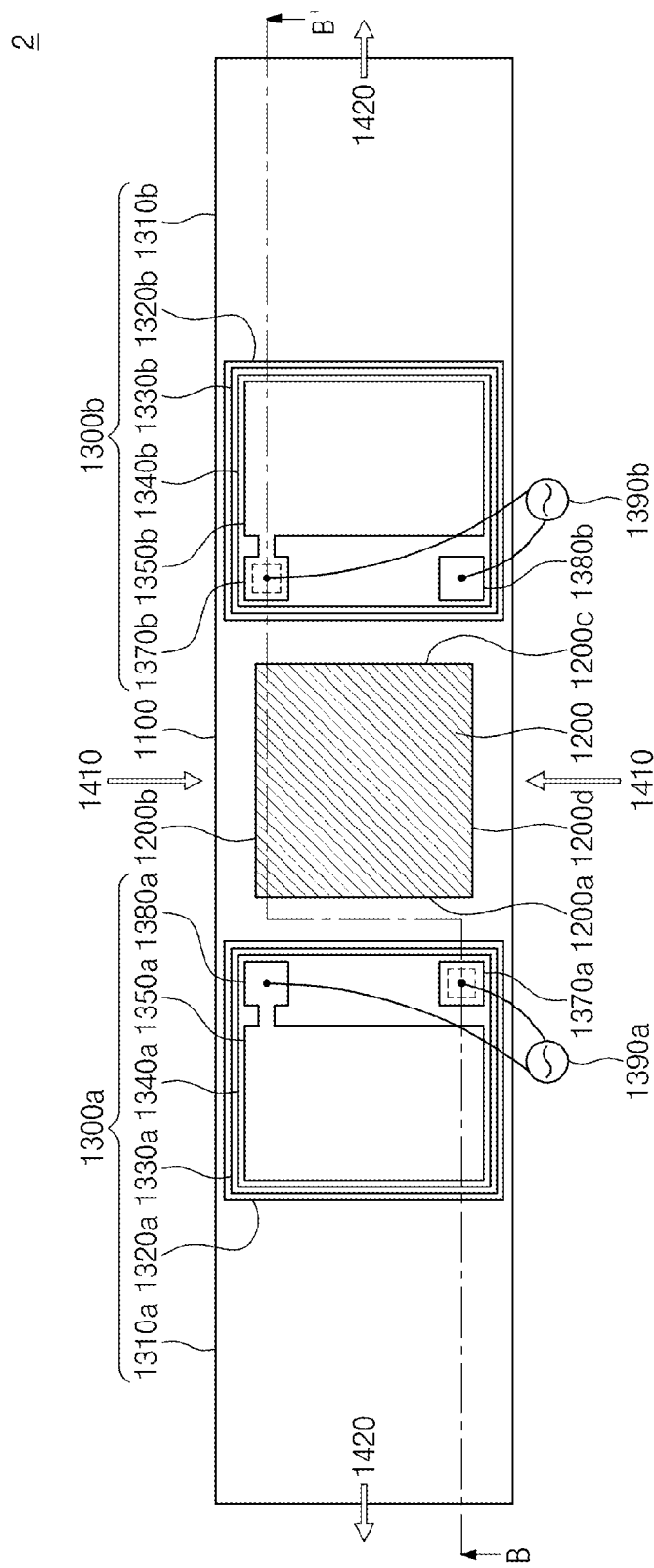
FIG. 3 is a plan view of a semiconductor device according to another embodiment of the inventive concept.
Figure 4:
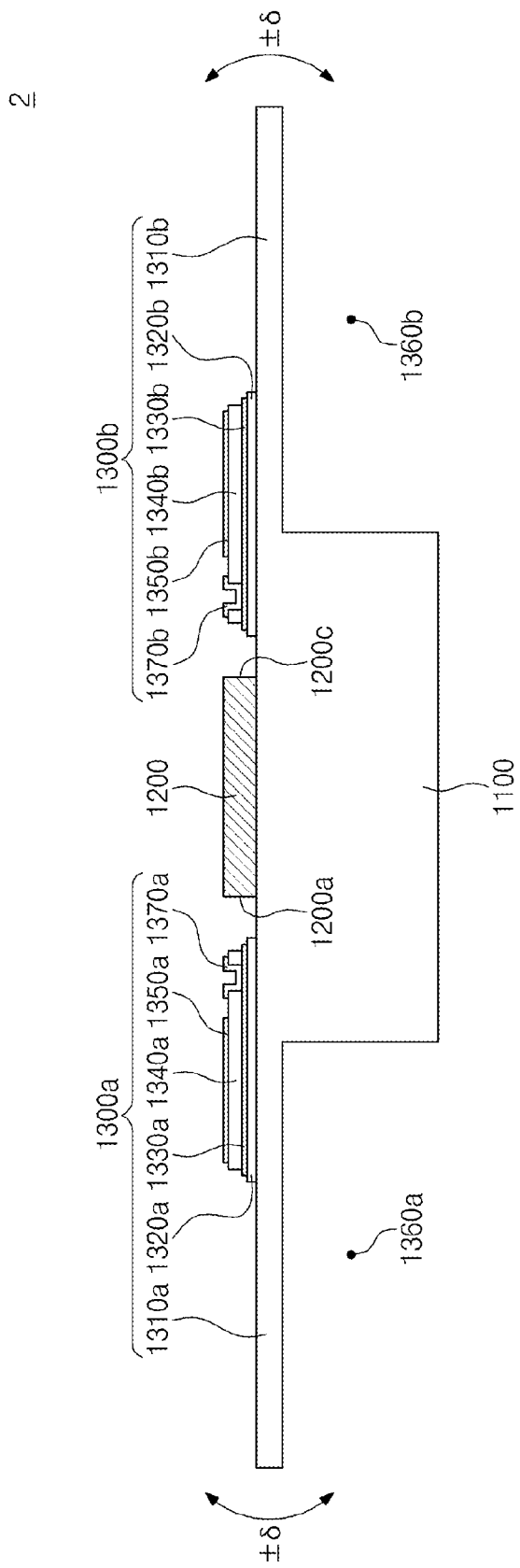
FIG. 4 is a cross-sectional view taken along line B-B' of FIG. 3.

FIG. 3 is plan view of a semiconductor device according to another embodiment of the inventive concept, and FIG. 4 is a cross-sectional view taken along line B-B' of FIG. 3. For convenience of description, description duplicated in an embodiment of the inventive concept will be omitted.

Referring to FIGS. 3 and 4, a semiconductor device 2 may include a substrate 1100, an active area 1200, a first cooling unit 1300a, and a second cooling unit 1300b. The first and second cooling units 1300a and 1300b may have the same structure as each other. The active area 1200 may be disposed between the first cooling unit 1300a and the second cooling unit 1300b. The first cooling unit 1300a may include a first cantilever 1310a, a first insulation layer 1320a, a first lower electrode 1330a, a first piezoelectric film 1340a, a first upper electrode 1350a, a first lower electrode pad 1370a, and a first upper electrode pad 1380b. The second cooling unit 1300b may include a second cantilever 1310b, a second insulation layer 1320b, a second lower electrode 1330b, a second piezoelectric film 1340b, a second upper electrode 1350b, a second lower electrode pad 1370b, and a second upper electrode pad 1380b. The active area 1200 may include a first side surface 1200a, a second side surface 1200b, a third side surface 1200c, and a fourth side surface 1200d, The first side surface 1200a may face the third side surface 1200c, and the second side surface 1200b may face the fourth side surface 1200d. The first side surface 1200a may be adjacent to the first cooling unit 1300a, and the third side surface 1200c may be adjacent to the second cooling unit 1300b.

The cantilevers 1310a and 1310b may extend from both side surfaces of the substrate 1100, respectively. For example, the cantilevers 1310a and 1310b may be disposed to be symmetrical to each other with respect to the active area 1200. The cooling medium 1410 may be provided toward the second side surface 1200b and a fourth side surface 1200d of the active area 1200. The cantilevers 1310a and 1310b may vibrate by extension and contraction of the piezoelectric films 1340a and 1340b, the high-temperature cooling medium 1420 may move from the active area 1200 toward the cooling units 1300a and 1300b by the vibration of the cantilevers 1310a and 1310b, and the cold cooling medium 1410 may move to the active area 1200. The first lower electrode pad 1370a and the first upper electrode pad 1380a may be connected to a first power source unit 1390a, and the second lower electrode pad 1370b and the second upper electrode pad 1380b may be connected to a second power source unit 1390b. Energy applied by the first and second power source units 1390a and 1390b may be equal to or different from each other. Thus, the first and second cantilevers 1310a and 1310b may have the same vibration frequency as each other or frequencies different from each other. The active area 1200 may be more efficiently cooled through the two cantilevers 1310a and 1310b.

Figure 5:
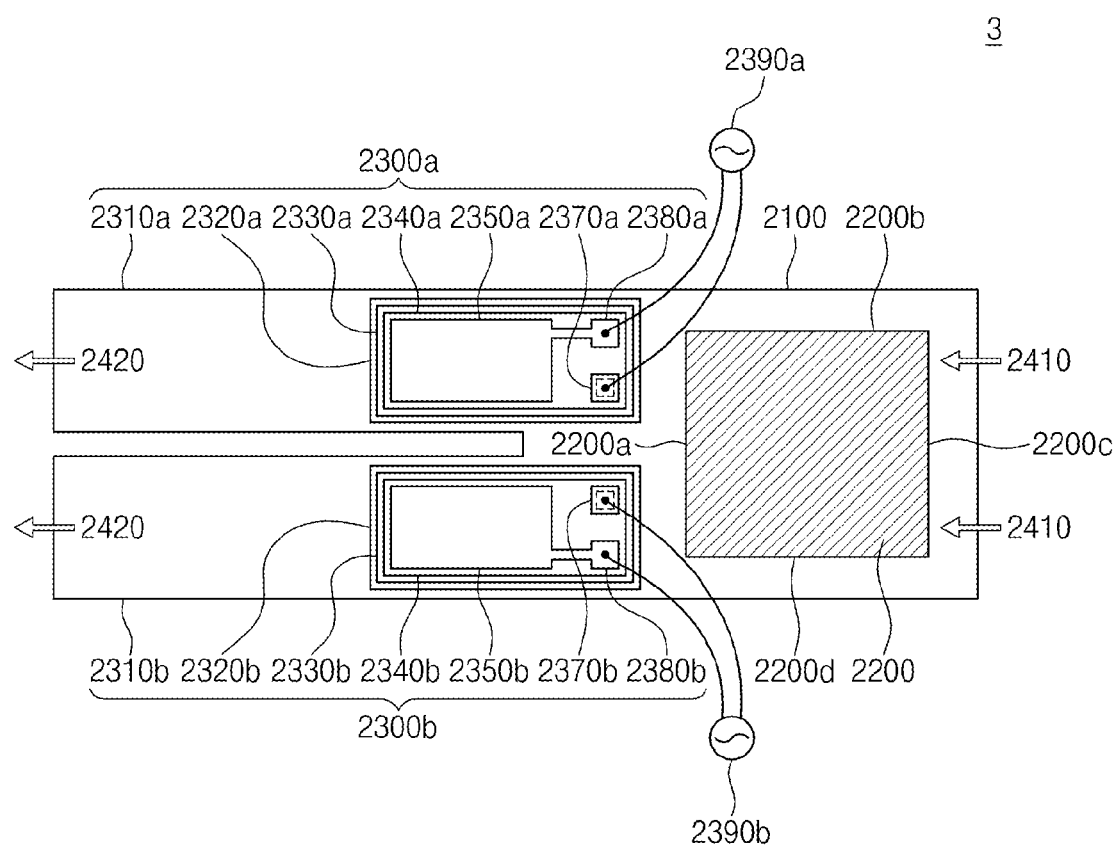
FIG. 5 is a plan view of a semiconductor device according to another embodiment of the inventive concept.

FIG. 5 is a plan view of the semiconductor device according to another embodiment of the inventive concept. For convenience of description, description overlapped to an embodiment of the inventive concept will be omitted.

Referring to FIG. 5, a semiconductor device 3 may include a first cooling unit 2300a and a second cooling unit 2300b that are disposed on one side of a substrate 2100. The first and second cooling units 2300a and 2300b may have the same structure as each other. The first cooling unit 2300a may include a first cantilever 2310a, a first insulation layer 2320a, a first lower electrode 2330a, a first piezoelectric film 2340a, a first upper electrode 2350a, a first lower electrode pad 2370a, and a first upper electrode pad 2380a, and the second cooling unit 2300b may include a second cantilever 2310b, a second insulation layer 2320b, a second lower electrode 2330b, a second piezoelectric film 2340b, a second upper electrode 2350b, a second lower electrode pad 2370b, and a second upper electrode pad 2380b. The active area 2200 may include a first side surface 2200a, a second side surface 2200b, a third side surface 2200c facing the first side surface 2200a, and a fourth side surface 2200d facing the second side surface 2200b. The first and second cooling units 2300a and 2300b may be adjacent to the first side surface 2200a and be arranged in parallel along a longitudinal direction of the first side surface 2200a.

The cantilevers 2310a and 2310b that are disposed on one side of the substrate 2100 may be spaced apart from each other in the longitudinal direction of the first side surface 2200a. The cooling media 2410 may be provided toward the third side surface 2200c of the active area 2200. The cantilevers 2310a and 2310b may vibrate by extension and contraction of the piezoelectric films 2340a and 2340b, the high-temperature cooling medium 2420 may move from the active area 2200 toward the cooling units 2300a and 2300b by the vibration of the cantilevers 2310a and 2310b, and the cold cooling medium 2410 may move to the active area 2000. The first lower electrode pad 2370a and the first upper electrode pad 2380a may be electrically connected to a first power source unit 2390a, and the second lower electrode pad 2370b and the second upper electrode pad 2380b may be electrically connected to a second power source unit 2390b. Energy applied by the power source units 2390a and 2390b may be equal to or different from each other. Thus, the cantilevers 2310a and 2310b may have the same frequency as each other or frequencies different from each other. The active area 2200 may be more efficiently cooled through the two cantilevers 2310a and 2310b.

Figure 6:
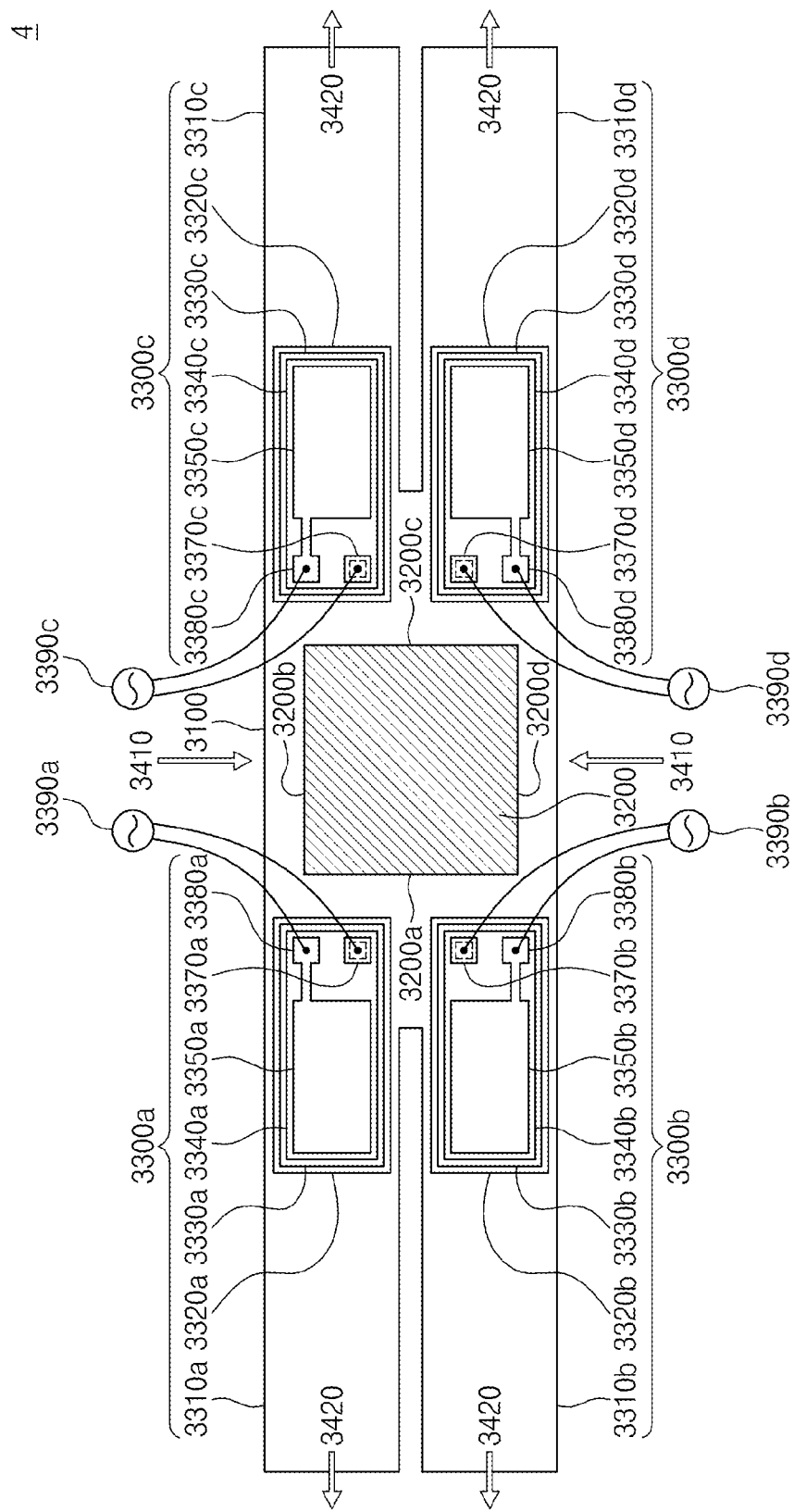
FIG. 6 is a plan view of a semiconductor device according to another embodiment of the inventive concept.

FIG. 6 is a plan view of the semiconductor device according to another embodiment of the inventive concept. For convenience of description, duplicated description will be omitted.

Referring to FIG. 6, a semiconductor device 4 may include a first cooling unit 3300a, a second cooling unit 3300b, a third cooling unit 3300c, and a fourth cooling unit 3300d that are provided at both sides of a substrate 3100. The first cooling unit 3300a, the second cooling unit 3300b, the third cooling unit 3300c, and the fourth cooling unit 3300d may have the same structure as each other. For example, the first cooling unit 3300a and the second cooling unit 3300b may be provided on one side of the substrate 3100, and the third cooling unit 3300c and the fourth cooling unit 3300d may be provided on the other side of the substrate 3100. The first cooling unit 3300a may include a first cantilever 3310a, a first insulation layer 3320a, a first lower electrode 3330a, a first piezoelectric film 3340a, a first upper electrode 3350a, a first lower electrode pad 3370a, and a first upper electrode pad 3380a, the second cooling unit 3300b may include a second cantilever 3310b, a second insulation layer 3320b, a second lower electrode 3330b, a second piezoelectric film 3340b, a second upper electrode 3350b, a second lower electrode pad 3370b, and a second upper electrode pad 3380b, the third cooling unit 3300c may include a third cantilever 3310c, a third insulation layer 3320c, a third lower electrode 3330c, a third piezoelectric film 3340c, a third upper electrode 3350c, a third lower electrode pad 3370c, and a third upper electrode pad 3380c, and the fourth cooling unit 3300d may include a fourth cantilever 3310d, a fourth insulation layer 3320d, a fourth lower electrode 3330d, a fourth piezoelectric film 3340d, a fourth upper electrode 3350d, a fourth lower electrode pad 3370d, and a fourth upper electrode pad 3380d. The active area 3200 may include a first side surface 3200a, a second side surface 3200b, a third side surface 3200c facing the first side surface 3200a, and a fourth side surface 3200d facing the second side surface 3200b.

The first and second cooling units 3300a and 3300b may be adjacent to the first side surface 3200a and be arranged in parallel along a longitudinal direction of the first side surface 3200a. The third and fourth cooling units 3300c and 3300d may be adjacent to the third side surface 3200c and be arranged in parallel along a longitudinal direction of the third side surface 3200c. The cooling media 3410 may be provided toward the second and fourth side surfaces 3200b and 3200d of the active area 3200. The cantilevers 3310a, 3310b, 3310c, and 3310d may vibrate by extension and contraction of the piezoelectric films 3340a, 3340b, 3340c, and 3340d, the high-temperature cooling medium 3420 may move from the active area 3200 toward the cooling units 3300a, 3300b, 3300c, and 3300d by the vibration of the cantilevers 3310a, 3310b, 3310c, and 3310d, and the cold cooling medium 3410 may move to the active area 3000. The first lower electrode pad 3370a and the first upper electrode pad 3380a may be electrically connected to a first power source unit 3390a, the second lower electrode pad 3370b and the second upper electrode pad 3380b may be electrically connected to a second power source unit 3390b, the third lower electrode pad 3370c and the third upper electrode pad 3380c may be electrically connected to a third power source unit 3390c, and the fourth lower electrode pad 3370d and the fourth upper electrode pad 3380d may be electrically connected to a fourth power source unit 3390d. Energy applied by the power source units 3390a, 3390b, 3390c, and 3390d may be equal to or different from each other. Thus, frequencies of the four cantilevers 3310a, 3310b, 3310c, and 3310d may have the same frequency as each other or frequencies different from each other. When the frequencies of the four cantilevers 3310a, 3310b, 3310c, and 3310d are adjusted, the active area 3200 may be more efficiently cooled down.

Unlike described above, the cantilever is not limited to a specific structure. The cantilever may have applicable and deformable shapes and have various lengths, widths, and thicknesses.

According to the embodiment of the inventive concept, the semiconductor device having the cooling structure integrated therein may be provided.

According to the embodiment of the inventive concept, since the separate cooling device or apparatus is not required, the semiconductor device with low costs, low noise, and low power consumption may be provided.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device comprising:
    a semiconductor substrate comprising a cantilever configured to generate a flow of cooling media through dynamic movement;
    an active area on the semiconductor substrate which an electronic device is provided on;
    an insulation layer disposed to be spaced apart from the active area on the semiconductor substrate;
    a lower electrode on the insulation layer;
    a piezoelectric film on the lower electrode; and
    an upper electrode on the piezoelectric film.

2. The semiconductor device of claim 1, wherein the semiconductor substrate comprises a main body on which the active area is disposed and the cantilever extending from at least one side of the main body, and
    the cantilever has a thickness less than that of the main body.

3. The semiconductor device of claim 2, wherein a top surface of the cantilever has the same level as a top surface of the main body, and an open space in which the cantilever is movable is provided below a bottom surface of the cantilever.

4. The semiconductor device of claim 2, wherein the cantilever has a thickness of about 1 μm to about 100 μm.

5. The semiconductor device of claim 2, wherein the cantilever and the main body are formed of the same material, and
the material comprises silicon (Si), silicon carbide (SiC), gallium nitride (GaN), or gallium arsenide (GaAs).

6. The semiconductor device of claim 2, wherein the insulation layer is disposed to cover portions of top surfaces of the cantilever and the main body.

7. The semiconductor device of claim 1, wherein the cantilever is provided on one side of the semiconductor substrate.

8. The semiconductor device of claim 1, wherein the cantilevers are provided on one side and the other side facing the one side of the semiconductor substrate.

9. The semiconductor device of claim 1, wherein the active area comprises a transistor, a diode, a thyristor, a central processing unit (CPU), an application specific integrated circuit (ASIC), a microsensor, a microactuator, or a microelectromechanical system (MEMS).

10. The semiconductor device of claim 1, further comprising a power source unit electrically connected to the lower electrodes and the upper electrodes,
wherein the power source unit applies electric energy to the piezoelectric film through the lower electrodes and the upper electrodes.

11. A semiconductor device comprising:
a semiconductor substrate including an active area on which an electronic device is provided; and
a first cooling unit configured to cool the active area through dynamic movement,
wherein the first cooling unit comprises:
a cantilever extending from one side of the semiconductor substrate, the cantilever having a thickness less than that of the semiconductor substrate;
a piezoelectric film configured to cause vibration of the cantilever and generate mechanical strain by applied electric energy; and
a pair of counter electrodes with the piezoelectric film therebetween.

12. The semiconductor device of claim 11, wherein the counter electrodes comprises:
a lower electrode on a bottom surface of the piezoelectric film; and
an upper electrode on a top surface of the piezoelectric film.

13. The semiconductor device of claim 11, further comprising:
a lower electrode pad on the exposed lower electrode; and
an upper electrode pad on the upper electrode.

14. The semiconductor device of claim 11, further comprising
a power source unit electrically connected to the lower electrode pad and the upper electrode pad,
wherein the power source unit is configured to supply electric energy to the piezoelectric film through the lower electrode pads and the upper electrode pads.

15. The semiconductor device of claim 11, further comprising a second cooling unit provided on the other side facing the one side of the semiconductor substrate,
wherein the second cooling unit has the same structure as the first cooling unit.

16. The semiconductor device of claim 11, further comprising an open space provided below a bottom surface of the cantilever,
wherein the open space has a height greater than an amplitude of the cantilever.

* * * * *